US008119501B2

(12) United States Patent
Harris et al.

(10) Patent No.: US 8,119,501 B2
(45) Date of Patent: Feb. 21, 2012

(54) METHOD FOR SEPARATING A SEMICONDUCTOR WAFER INTO INDIVIDUAL SEMICONDUCTOR DIES USING AN IMPLANTED IMPURITY

(75) Inventors: Edward B. Harris, Fogelsville, PA (US); Kurt G. Steiner, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 37 days.

(21) Appl. No.: 12/618,936

(22) Filed: Nov. 16, 2009

(65) Prior Publication Data
US 2010/0221893 A1 Sep. 2, 2010

Related U.S. Application Data

(63) Continuation of application No. PCT/US2007/069145, filed on May 17, 2007.

(51) Int. Cl.
*H01L 21/00* (2006.01)
(52) U.S. Cl. ........ 438/462; 438/458; 438/459; 438/460; 438/461; 438/463; 257/617; 257/620; 257/E21.602
(58) Field of Classification Search .......... 438/460–463; 257/617, 620, E21.602
See application file for complete search history.

(56) References Cited

U.S. PATENT DOCUMENTS

| | | | |
|---|---|---|---|
| 6,372,609 B1 | 4/2002 | Aga et al. | |
| 6,372,610 B1 * | 4/2002 | Chang et al. | 438/460 |
| 6,648,743 B1 * | 11/2003 | Burke | 451/526 |
| 7,482,251 B1 * | 1/2009 | Paulsen et al. | 438/460 |
| 2002/0076904 A1 * | 6/2002 | Imler | 438/462 |
| 2003/0134468 A1 * | 7/2003 | Wang et al. | 438/243 |
| 2004/0166649 A1 | 8/2004 | Bressot et al. | |
| 2004/0171232 A1 | 9/2004 | Cayrefourcq et al. | |
| 2004/0253794 A1 * | 12/2004 | Faris | 438/459 |
| 2005/0130390 A1 * | 6/2005 | Andrews et al. | 438/458 |
| 2006/0049487 A1 | 3/2006 | Sato et al. | |

FOREIGN PATENT DOCUMENTS

| | | |
|---|---|---|
| DE | 10328876 A1 | 2/2005 |
| WO | 2008143663 A1 | 11/2008 |

OTHER PUBLICATIONS

International Search Report & Written Opinion dated Feb. 4, 2008 for priority case PCT/US2007/069145.

* cited by examiner

*Primary Examiner* — Charles Garber
*Assistant Examiner* — Yasser Abdelaziez

(57) ABSTRACT

Provided is a method for separating a semiconductor wafer into individual semiconductor dies. The method for separating the semiconductor wafer, among other steps, may include implanting an impurity into regions of a semiconductor wafer proximate junctions where semiconductor dies join one another, the impurity configured to disrupt bonds in the semiconductor wafer proximate the junctions and lead to weakened regions. The method for separating the semiconductor wafer may further include separating the semiconductor wafer having the impurity into individual semiconductor dies along the weakened regions.

18 Claims, 4 Drawing Sheets

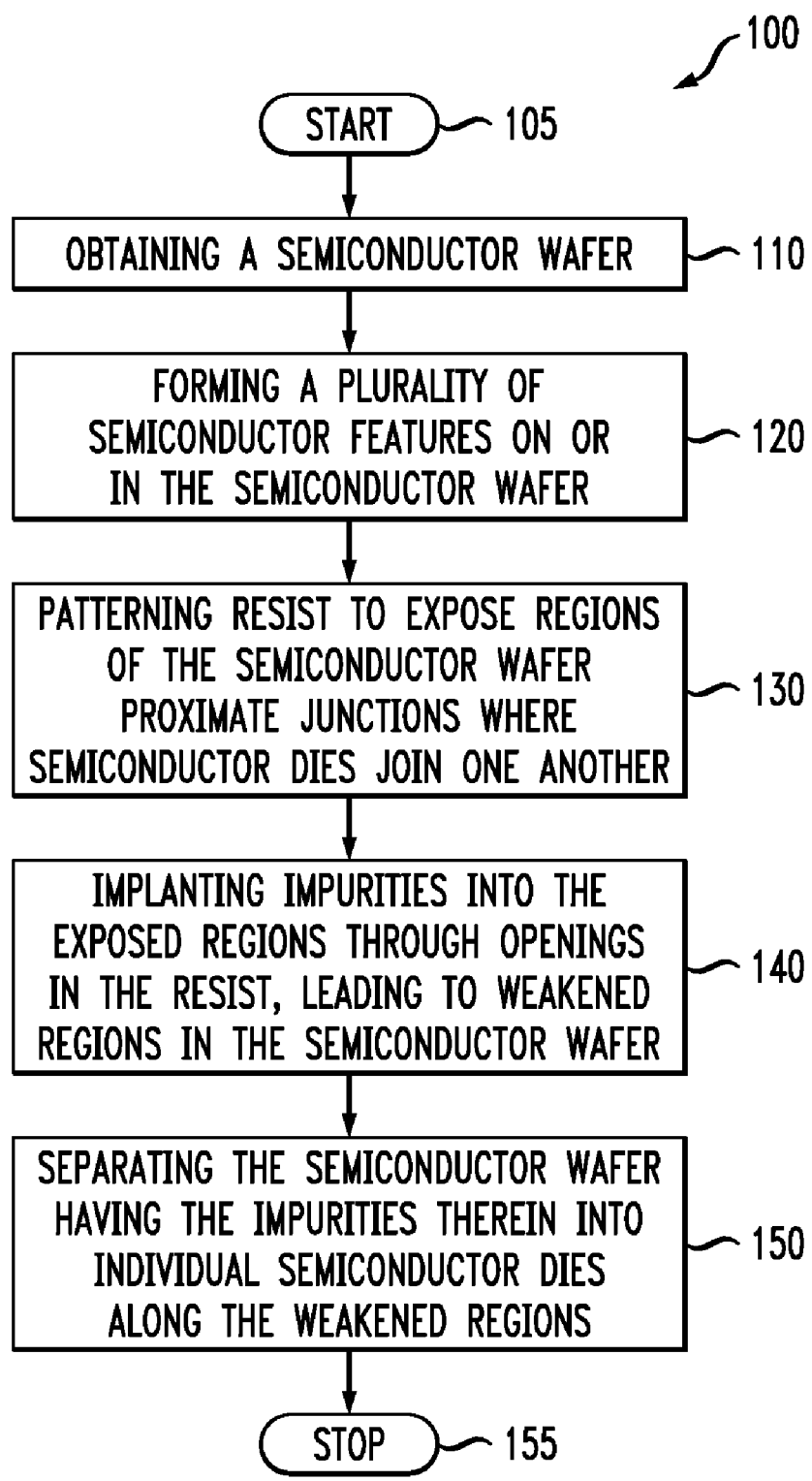

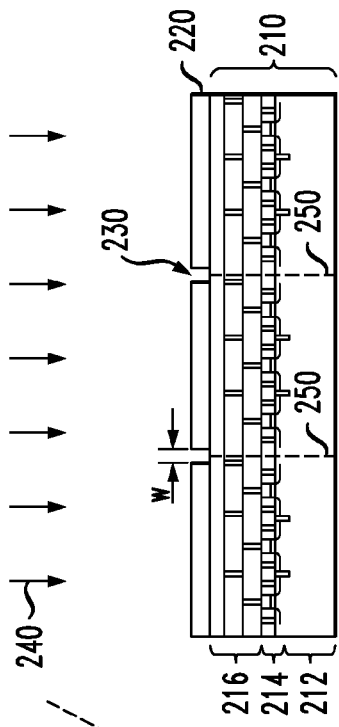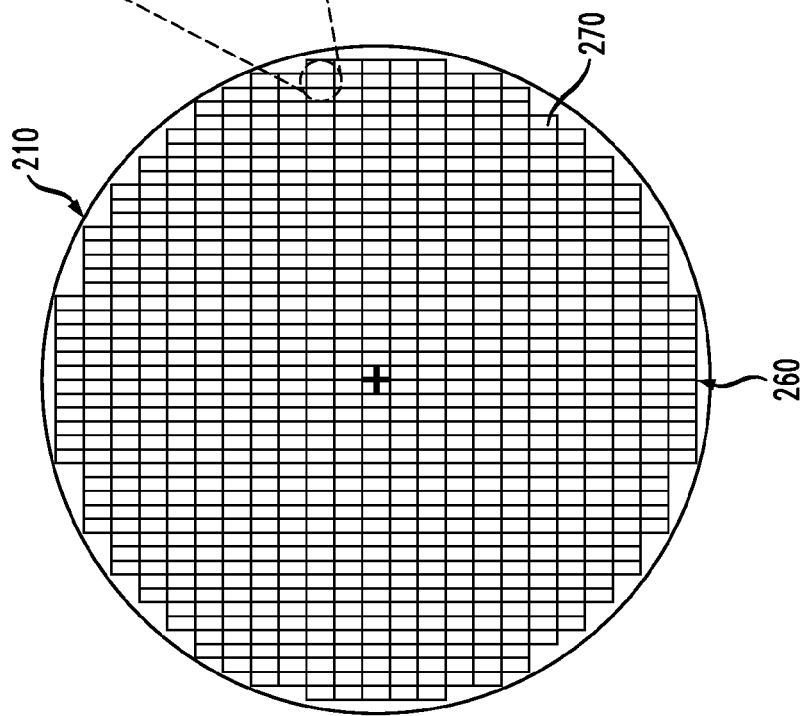

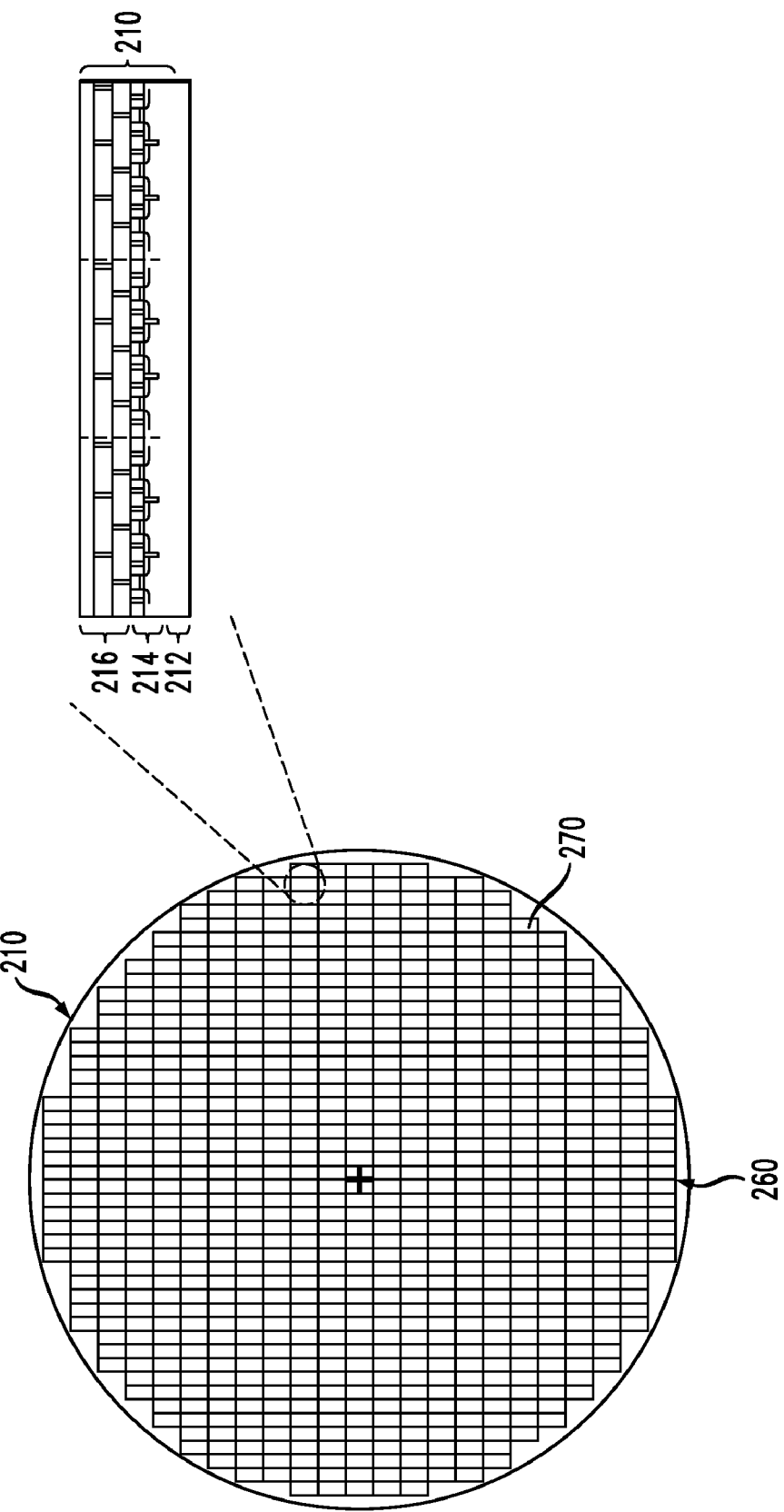

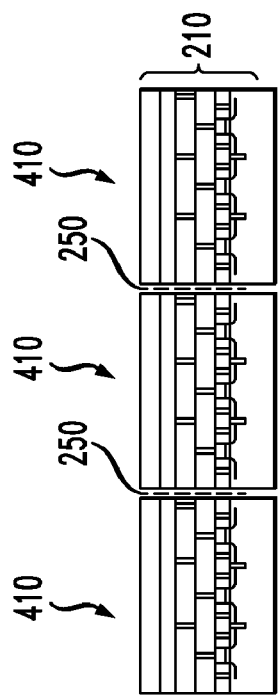
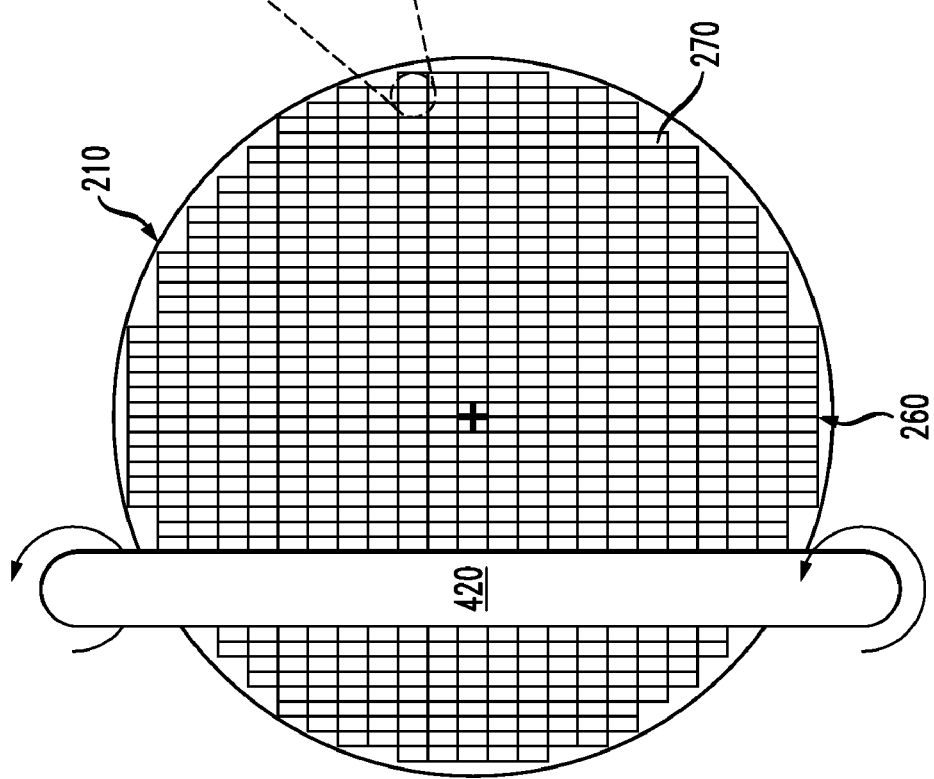
FIG. 4A
FIG. 4B

METHOD FOR SEPARATING A SEMICONDUCTOR WAFER INTO INDIVIDUAL SEMICONDUCTOR DIES USING AN IMPLANTED IMPURITY

CROSS-REFERENCE TO RELATED APPLICATIONS

This application is a continuation of International Application No. PCT/US2007/069145, with an international filing date of May 17, 2007, now abandoned, entitled "METHOD FOR SEPARATING A SEMICONDUCTOR WAFER INTO INDIVIDUAL SEMICONDUCTOR DIES USING AN IMPLANTED IMPURITY", which was published in English under International Publication Number WO 2008/143663 on 27 Nov. 2008 and is incorporated herein by reference in its entirety.

TECHNICAL FIELD OF THE INVENTION

The invention is directed, in general, to a method for separating a semiconductor wafer into individual semiconductor dies and, more specifically, to a method for separating a semiconductor wafer into individual semiconductor dies using an implanted impurity and a method for manufacturing semiconductor dies using the same.

BACKGROUND OF THE INVENTION

During integrated circuit fabrication, a plurality of integrated circuits (semiconductor dies) are formed on a single semiconductor wafer simultaneously by a series of material deposition and removal processes. The individual semiconductor dies are then separated from the wafer, in a process called dicing. Wafer dicing generally involves sawing the wafer with a circular saw blade or by scribing and breaking the wafer (if the wafer is crystalline). The portions of the semiconductor wafer where the dies are separated are known as kerfs, or in the parlance of semiconductor manufacturing: streets or scribe streets. Scribe street width is dictated by a combination of wafer properties, blade dimensions and properties, scribe tool dimensions and properties, etc.

One who is of skill in the art will recognize that a conventional scribe street may have a street width of around 62 microns. With a blade or scribe tool width of about 30 microns and a street width of 62 microns, there is only 16 microns clearance on either side of the blade or scribe tool. The semiconductor manufacturing industry, however, is moving toward narrower scribe streets, e.g., 52 microns and below, in an effort to obtain higher die yields per wafer. In order to work with a street width of 52 microns, the blade or scribe tool must be no more than 20 microns thick to maintain the same clearance on either side of the blade. However, reducing the saw blade or scribe tool thickness to enable a narrower kerf has practical limitations.

Accordingly, what is needed in the art is a method for separating a semiconductor wafer into its individual dies that is not limited by the aforementioned thickness.

SUMMARY OF THE INVENTION

To address the above-discussed deficiencies of the prior art, provided is a method for separating a semiconductor wafer into individual semiconductor dies. The method for separating the semiconductor wafer, among other steps, may include placing an impurity into regions of a semiconductor wafer proximate junctions where semiconductor dies join one another, the impurity configured to disrupt bonds in the semiconductor wafer proximate the junctions and lead to weakened regions. The method for separating the semiconductor wafer may further include separating the semiconductor wafer having the impurity into individual semiconductor dies along the weakened regions.

Further provided is a method for manufacturing semiconductor dies. This method, without limitation, may include obtaining a semiconductor wafer, and forming a plurality of semiconductor features in or on the semiconductor wafer. The method for manufacturing semiconductor dies may further include placing an impurity into regions of the semiconductor wafer proximate junctions where semiconductor dies join one another, the impurity configured to disrupt bonds in the semiconductor wafer proximate the junctions and lead to weakened regions, and then separating the semiconductor wafer having the semiconductor features and impurity into individual semiconductor dies along the weakened regions.

BRIEF DESCRIPTION OF THE DRAWINGS

For a more complete understanding of the invention, reference is now made to the following descriptions taken in conjunction with the accompanying drawings, in which:

FIG. 1 illustrates a flow diagram indicating an embodiment of a method for manufacturing semiconductor dies; and FIGS. 2A-4B illustrate processing steps showing an embodiment of a method for separating a semiconductor wafer into individual semiconductor dies.

DETAILED DESCRIPTION

This disclosure is based, at least in part, on the recognition that impurities may be implanted in a semiconductor wafer proximate junctions where semiconductor dies join one another to assist in the separation of the semiconductor wafer into its individual semiconductor dies. The disclosure further recognizes that the implanted impurities may disrupt bonds in the semiconductor wafer proximate the junctions leading to weakened regions, and that the semiconductor wafer may be separated into its individual dies along the weakened regions.

FIG. 1 illustrates a flow diagram 100 indicating an embodiment of a method for manufacturing semiconductor dies. The flow diagram, in addition to the method for manufacturing semiconductor dies, includes a subset including a method for separating a semiconductor wafer into individual semiconductor dies. Accordingly, the flow diagram 100 should not be used to limit the disclosure to any specific steps.

The flow diagram 100 begins in a start step 105. Thereafter, in a step 110, a semiconductor wafer is obtained. The semiconductor wafer may comprise many different materials. For instance, among others, the semiconductor wafer may comprise a semiconductor, conductor or insulator material used in microelectronics or a similar technical field. For example, a group (III)-(V) semiconductor, such as GaAs, InP or GaN, an alloy of a group (III)-(V) semiconductor, silicon germanium, silicon carbide, synthetic quartz and fused silica, as well as combinations of these materials or other non-listed materials, might be used.

The semiconductor wafer obtained may be at many different stages of manufacture. For instance, in one embodiment the semiconductor wafer is a bare semiconductor wafer having only a single layer and no functional features therein (e.g., taken directly from the ingot). In another embodiment, the semiconductor wafer comprises a plurality of layers, one of which may be a buried oxide (e.g., silicon-on-insulator (SOI)). In yet another embodiment, the semiconductor wafer comprises a plurality of layers, certain ones of which might be similar to the materials discussed above. In this embodiment, the semiconductor wafer may already contain one or more functional features (e.g., active features) therein or thereon.

Thereafter, in a step 120, one or more additional semiconductor features may be formed on, in or over the semiconductor wafer. This step 120 may include many different processing steps. For example, the step 120 might include forming one or more active features (e.g., transistor features, capacitor features, inductor features, etc.) on, in or over the semiconductor wafer. The step 120 may additionally include forming interconnect features on, in or over the semiconductor wafer. The step 120 might also include patterning one or more photoresist features on, in or over the semiconductor wafer. Nevertheless, the step 120 should not be limited to any single or collection of processing steps.

After step 120, in a step 130, resist may be patterned to expose regions of the semiconductor wafer proximate junctions where semiconductor dies join one another. Those skilled in the art understand the process of patterning resist (e.g., photoresist in one embodiment). For example, the process of patterning resist may begin with the application of a layer of resist material to the semiconductor wafer, followed by the selective exposure of the resist layer to an energy source, wherein portions of the resist layer are changed in character due to their exposure to the energy source. After such exposure, the resist layer may then be developed, for example by a "wet development process" employing liquid chemical solvents, to selectively remove portions of the resist. What would result is a desired pattern in the resist, which in this embodiment would expose the regions of the semiconductor wafer proximate junctions wherein semiconductor dies join one another. In another embodiment, the resist would expose at least a portion of the scribe streets in the semiconductor wafer.

In a step 140, impurities may be placed into regions of the semiconductor wafer (e.g., the exposed regions in this embodiment). The impurities, in one embodiment, are configured to disrupt bonds in the semiconductor wafer proximate the junctions and lead to weakened regions. The impurity used to ultimately form the weakened regions may vary. For example, in one embodiment the impurities are one or more rare gas ions. For instance, it has been observed that Hydrogen ions and Helium ions, either alone or in combination, work well as the impurity. Nevertheless, the impurity may comprise other ions, such as boron or phosphorous, or be a combination of these ions and previously discussed ions. In certain applications, however, boron and phosphor should be avoided, so as to prevent counter-doping of the surrounding areas. Other impurities may also be used.

The impurities may be placed within the semiconductor wafer using a variety of different processes. In one embodiment, however, the impurities are placed within the semiconductor wafer using an implantation technique. For example, in one embodiment the impurities are implanted into the semiconductor wafer using an implant energy ranging from about 10 keV to about 1000 keV and an implant dose ranging from about 1E12 atoms/cm$^3$ to about 1E16 atoms/cm$^3$. In another embodiment, the implant conditions are chosen such that the weakened regions extend from the surface of the semiconductor wafer that the implant originally contacts to an opposing surface. Other implant conditions could nonetheless also be used, including implants that do not require the aforementioned resist.

Thereafter, in a step 150, the semiconductor wafer having the impurity therein may be separated into its individual semiconductor dies along the weakened regions. The separation of the semiconductor wafer into the individual dies may include many different steps or combination of steps. For instance, in one embodiment the semiconductor wafer having the weakened regions may be subjected to a thermal stress to cause the weakened regions to fracture, thus allowing the semiconductor dies to separate. The thermal stress may be imparted by, among others, annealing the semiconductor wafer having the impurities included therein at the appropriate temperature. Those skilled in the art understand the appropriate temperature required to fracture the semiconductor wafer while remaining within the allotted thermal budget.

Likewise, the semiconductor wafer having the weakened regions may be subjected to a mechanical stress to cause the weakened regions to fracture. The mechanical stress may be imparted by, among others, a mechanical apparatus that rolls across the surface of the semiconductor wafer. In an alternative embodiment, both mechanical and thermal stress is used to assist in the separation of the semiconductor dies. After fracturing the semiconductor wafer into its individual dies the process may stop in a stop step 155.

The flow diagram 100 of FIG. 1 includes certain steps that might be used to manufacture semiconductor dies according to one embodiment of the disclosure. In alternative embodiments, fewer or additional steps may be used to manufacture semiconductor dies according to alternative embodiments of the disclosure. Additionally, the particular order that each of the steps is conducted may vary. Thus, for example, steps 130 and 140 might occur prior to step 120 in certain embodiments.

FIGS. 2A-4B illustrate processing steps showing an embodiment of a method for separating a semiconductor wafer into individual semiconductor dies. FIG. 2A initially illustrates a semiconductor wafer 210. The wafer 210 shown in FIG. 2A includes a notch 260 and one or more die regions 270. The notch 260, as those skilled in the art expect, may be used along with the center of the wafer 210 (or another known point) to coordinate various different features on the wafer 210, including the location of specific semiconductor features, the die regions 270, etc.

The one or more die regions 270 represent die boundaries for different die on the semiconductor wafer 210. These die boundaries may ultimately be the scribe streets of which the wafer 210 is diced into its individual semiconductor die. Moreover, the die regions 270 may or may not be visible to the human eye, whether or not using a magnification means. The number of die regions 270 on a given wafer 210 generally varies based upon the wafer 210 size and the desired size for each individual die region 270.

Turning to FIG. 2B, illustrated is a blown up view of a portion of the semiconductor wafer 210 of FIG. 2A. As shown, the semiconductor wafer 210 includes a collection of different materials, layers and features. For instance, the semiconductor wafer 210 includes a base layer 212 (e.g., single crystal silicon in one embodiment), an active feature layer 214 (e.g., including transistor devices in one embodiment) and an interconnect feature layer 216 (e.g., including one or more layers of interconnects in one embodiment). The base layer 212, active feature layer 214 and interconnect feature layer 216 may comprise any one or collection of materials discussed above, among others. Likewise, additional layers may exist in the semiconductor wafer 210 at this stage of manufacture.

As is illustrated in FIG. 2B, patterned resist 220 is formed over the semiconductor wafer 210 to expose regions 230 of the semiconductor wafer 210. A process similar to that discussed above could be used to pattern the resist 220. The exposed regions 230, in one embodiment, are located proximate junctions where the semiconductor dies 270 join one another. In another embodiment, the exposed regions 230 expose at least a portion of scribe streets in the semiconductor wafer 210.

The exposed regions 230, in one embodiment, have a width (w) of less than about 5 microns. The exposed regions 230, in an alternative embodiment, have a width (w) of less than about 1 micron. The aforementioned widths (w) are significantly less than a width of a saw blade or scribe tool, as might have been used in the past to dice the semiconductor wafer 210 into its individual semiconductor dies. Accordingly, significant semiconductor wafer 210 real estate may be saved.

FIG. 2B further illustrates that an impurity 240 is introduced into the exposed regions 230 through openings in the resist 220. The impurity 240 may be placed within the semiconductor using, among others, a process similar to that discussed above. As discussed above, the impurity 240 is configured to disrupt the bonds in the semiconductor wafer 210 proximate the junctions where the semiconductor dies 270 join one another. The impurity 240 may further lead to weakened regions 250 in the semiconductor wafer 210. The weakened regions 250, in one embodiment, extend substantially perpendicular to an initial surface that the impurity 240 is placed. This is in direct contrast to other processes that might create a weakened region that extends substantially parallel to the surface.

The embodiment of FIGS. 2A and 2B illustrate that the resist 220 is used to precisely place the impurity 240 within the semiconductor substrate 210. Nevertheless, other embodiments exist wherein resist is not required. For instance, one known embodiment exists wherein a direct write implant is used. For example, a proton beam driven by an xy stage could be used to include the impurity 240 within the semiconductor substrate 210.

FIGS. 3A and 3B illustrate the semiconductor wafer 210 of FIGS. 2A and 2B after removing at least a portion of a backside (e.g., an opposing surface to the surface that the impurity 240 was initially placed) of the semiconductor wafer 210. In one embodiment, a conventional wafer backgrind is used to reduce the thickness of the semiconductor wafer 210 to a value ranging from about 200 microns to about 400 microns. In an alternative embodiment, a greater or lesser backgrind is used. The process of removing at least a portion of the backside of the semiconductor wafer 210 is designed to assist in the separation of the semiconductor wafer 210 into its individual semiconductor dies.

FIGS. 4A and 4B illustrate the semiconductor wafer 210 of FIGS. 3A and 3B after separating the semiconductor wafer 210 having the impurity 240 into individual semiconductor dies 410 along the weakened regions 250. As previously indicated, the process of separating the semiconductor wafer 210 into its individual dies may be assisted with the addition of stress. The embodiment of FIGS. 4A and 4B illustrate the use of a mechanical stress applied using a roller 420. While a roller 420 is used in this embodiment to provide the stress, those skilled in the art understand the various other techniques and devices that might be used. It should again be noted that thermal stress or another form of stress (e.g., acoustical stress) might also be used.

The process disclosed above with respect to FIGS. 1 through 4B indicates that the impurity is placed within the semiconductor wafer after the formation of one or more features therein, particularly after the formation of the interconnect structures. Certain embodiments may exist wherein the impurity is included within the semiconductor wafer prior to any features being formed thereon or therein. Likewise, certain embodiments may exist wherein the impurity is included within the semiconductor wafer shortly after forming the active features thereon or therein.

The inventive aspects disclosed above provide certain benefits over other conventional processes. For instance, the above disclosure allows more silicon utilization since the die lanes can be smaller than allowed in other saw and scribe technologies. Furthermore, it may ultimately have a lower process cost since the use of the implant to separate the semiconductor wafer into its individual dies may be small as compared to purchasing and maintaining conventional saw and scribe tools.

Additional details regarding the inclusion of an impurity, as well as other relevant information, may be found in U.S. Pat. Nos. 6,335,258, 6,020,252, 5,877,070, 6,372,609, as well as U.S. Patent Application Publication Nos. 2004/0171232 and 2004/0166649, all of which are incorporated herein by reference as if incorporated in their entirety.

Those skilled in the art to which the above disclosure relates will appreciate that other and further additions, deletions, substitutions and modifications may be made to the described embodiments without departing from the scope of the invention.

What is claimed is:

1. A method for separating a semiconductor wafer into individual semiconductor dies, comprising:
   placing an impurity into regions of a surface of a semiconductor wafer proximate junctions where semiconductor dies join one another, the impurity configured to disrupt bonds in the semiconductor wafer proximate the junctions and lead to weakened regions;
   removing a portion of an opposing surface of the semiconductor wafer after placing the impurity into the regions of the surface; and separating the semiconductor wafer having the impurity and the portion removed into individual semiconductor dies along the weakened regions;
   wherein separating the semiconductor wafer includes separating the semiconductor wafer using mechanical or thermal stress.

2. The method of claim 1 wherein placing an impurity includes implanting rare gas ions into the regions.

3. The method of claim 1 wherein placing an impurity includes implanting hydrogen ions into the regions.

4. The method of claim 1 wherein the regions have a width of less than about 5 microns.

5. The method of claim 1 wherein the regions have a width of less than about 1 micron.

6. The method of claim 1 wherein the impurity is placed into the semiconductor wafer through openings in resist.

7. The method of claim 1 wherein the impurity is placed within scribe streets in the semiconductor wafer.

8. The method of claim 1 wherein separating the semiconductor wafer includes separating the semiconductor wafer using a roller to create the mechanical stress.

9. The method of claim 1 wherein the impurity is placed into a surface and further wherein the weakened regions extend substantially perpendicular to the surface.

10. A method for manufacturing semiconductor dies, comprising:
    obtaining a semiconductor wafer; forming a plurality of semiconductor features on or in the semiconductor wafer; placing an impurity into regions of a surface of the semiconductor wafer proximate junctions where semiconductor dies join one another, the impurity configured to disrupt bonds in the semiconductor wafer proximate the junctions and lead to weakened regions;

removing a portion of an opposing surface of the semiconductor wafer after placing the impurity into the regions of the surface; and separating the semiconductor wafer having the semiconductor features impurity and portions removed into individual semiconductor dies along the weakened regions;

wherein separating the semiconductor wafer includes separating the semiconductor wafer using mechanical or thermal stress.

11. The method of claim 10 wherein placing an impurity includes implanting rare gas ions into the regions.

12. The method of claim 10 wherein placing an impurity includes implanting hydrogen ions into the regions.

13. The method of claim 10 wherein the regions have a width of less than about 5 microns.

14. The method of claim 10 wherein the regions have a width of less than about 1 micron.

15. The method of claim 10 wherein the impurity is placed into the semiconductor wafer through openings in resist.

16. The method of claim 10 wherein the impurity is placed within scribe streets in the semiconductor wafer.

17. The method of claim 10 wherein separating the semiconductor wafer includes separating the semiconductor wafer using a roller to create the mechanical stress.

18. The method of claim 10 wherein the impurity is placed into a surface and further wherein the weakened regions extend substantially perpendicular to the surface.

* * * * *